United States Patent
Lima et al.

(10) Patent No.: US 6,590,785 B1
(45) Date of Patent: Jul. 8, 2003

(54) CABLE MANAGEMENT (76) Inventors: David Lima, 1816 Farndon Ave., Los Altos, CA (US) 94024; Keith Jeffrey Hocker, 21150 Canyon Oak Way, Cupertino, CA (US) 95014; Mario David Bogdan, 67 Fairview Plz., #3, Los Gatos, CA (US) 95030; Tony Joseph Lilios, P.O. Box 1078, Palo Alto, CA (US) 94302

( * ) Notice: Subject to any disclaimer, the term of this patent is extended or adjusted under 35 U.S.C. 154(b) by 0 days.

(21) Appl. No.: 09/940,416

(22) Filed: Aug. 27, 2001

(51) Int. Cl.⁷ .................................................. H02B 1/01
(52) U.S. Cl. ...................... 361/825; 361/825; 361/683; 174/69; 174/72 A; 439/572
(58) Field of Search .................................. 361/826, 729, 361/683, 825, 827, 756, 227; 211/26, 756; 174/69, 70 R, 72 C, 72 A, 135; 439/572

(56) References Cited

U.S. PATENT DOCUMENTS

| | | | | |
|---|---|---|---|---|
| 3,573,373 A | * | 4/1971 | Mullin et al. | 174/72 A |
| 3,831,128 A | * | 8/1974 | Paluch | 174/60 |
| 4,946,300 A | * | 8/1990 | Makita | 361/680 |
| 5,129,030 A | * | 7/1992 | Petrunia | 385/135 |
| 5,593,046 A | * | 1/1997 | Katsuura et al. | 211/162 |
| 5,853,155 A | * | 12/1998 | Sullivan et al. | 211/201 |
| 6,127,631 A | * | 10/2000 | Green et al. | 174/135 |
| 6,175,079 B1 | * | 1/2001 | Johnston et al. | 174/50 |
| 6,407,933 B1 | * | 6/2002 | Bolognia et al. | 174/168 |

FOREIGN PATENT DOCUMENTS

DE          4129740 A1  *  3/1993  .......... B65D/33/08

* cited by examiner

*Primary Examiner*—David Martin
*Assistant Examiner*—Hung Bui
(74) *Attorney, Agent, or Firm*—Shumaker & Sieffert, PA (57) ABSTRACT

A cable manager is attached to a device, connected to a number of cables. The cables are engaged by the cable manager in order to appropriately guide and organize the cables. The cable manager is sized and positioned so that when in a normal operating position, certain components remain freely accessible. When so desired, a technician or other user can easily raise and secure the cable manager without disconnecting the cables, thereby moving the coupled cables out of the way of various components of the device. Thus, components obstructed by the cable manager when in the normal operating position can be accessed and serviced, or otherwise utilized.

76 Claims, 7 Drawing Sheets

CABLE MANAGEMENT

TECHNICAL FIELD

The invention generally relates to cabling devices and, more specifically, mechanisms for arranging and organizing cables.

BACKGROUND

Many devices require connection to one or more cables. One common example is a desktop computer, which typically has connections for a number of cables including cables for video connections, one or more printers, a keyboard, a mouse, and any number of other peripheral devices. Thus, the number of cables employed can be fairly large and cumbersome even for this basic device.

There are, of course, more sophisticated devices that have connections for even greater numbers of cables. One particular device, a network router, may require the connection of 200–300 cables or more, each of which must be securely coupled to the proper connector. It may be difficult and time consuming to work on the router if the cables are in the way. Thus, it is desirable to manage the cables so as to minimize the possibility that one or more of the cables may become disconnected if accidentally disturbed.

SUMMARY

Apparatus and methods consistent with the principles of the invention provide a cable manager that can be affixed to a chassis. The cable manager serves to guide each of the cables attached to the chassis and to keep them properly oriented. The cable manager is positioned so as to not interfere with certain components of the chassis during normal operation. The cable manager is also moveable between at least two positions, so that the cable manager and the attached cables can be easily moved to allow access to the chassis.

In one embodiment, the invention is directed to a cable manager having a trough with a plurality of bobbins for guiding cables. A four bar linkage is used to attach the trough to an external portion of a chassis. The four bar linkage allows the trough to be positioned in, and locked in, at least an upper and a lower position. The lower position may be chosen for normal use and operation of the chassis. The size of the cable manager is chosen so as to not obstruct any components that need to remain unobstructed. For example, it is generally desirable to keep the interface cards to which the cables are connected, as well as an air intake for the chassis, free and unobstructed. In the upper position, the cable manger completely exposes any components it blocks while in the lower position, and allows them to be serviced or otherwise utilized.

In another embodiment, the present invention is directed to a cable manager coupleable, to a device having one or more cables attachable thereto. The cable manager includes a cable guide, and a bracket assembly coupled between the cable guide and the device. The bracket assembly is configured to allow the cable guide to be moved between at least two positions relative to the device. The bracket assembly may include at least one four bar linkage. The four bar linkage may include a first bracket coupleable to the device, a second bracket coupleable to the cable guide, a first link arm pivotally connected to the first bracket and pivotally connected to the second bracket, and a second link arm pivotally connected to the first bracket and pivotally connected to the second bracket.

The cable guide may include a trough, and a plurality of bobbins coupled with the trough. Cables may be passed between adjacent bobbins and supported and guided by the trough. The cable manager may also include a locking assembly coupled between the cable guide and the bracket assembly so that the cable guide can be selectively locked into one of the at least two positions.

In another embodiment, the cable manager may be coupleable to a chassis having a plurality of cables. The cable manager includes a first four bar assembly having a first upper bracket coupleable to an outer perimeter of the router, a first lower bracket, a first upper link arm pivotally connected between the first upper bracket and the first lower bracket and a first lower link arm pivotally connected between the first upper bracket and the first lower bracket. A second four bar assembly may also be provided and includes a second upper bracket coupleable to an outer perimeter of the chassis, a second lower bracket, a second upper link arm pivotally connected between the second upper bracket and the second lower bracket and a second lower link arm pivotally connected between the second upper bracket and the second lower bracket. A torsion bar may be provided that is connected between the first four bar assembly and the second four bar assembly. A support tray is coupled with the first lower bracket and the second lower bracket. The support tray is moveable relative to the chassis between a raised position and lowered position. A trough may be coupled with the support tray and include a plurality of bobbins. The trough includes an uppermost edge and a lowermost edge.

In another embodiment, the cable manager may include a tray that is configured to receive and guide cables. The cable manager may also include a first four bar linkage coupleable between the tray and a device having one or more cables. The tray is positionable in at least two positions with respect to the device. The cable manager also includes a locking mechanism coupled between the tray and the four bar linkage and is configured to selectively secure the tray relative to the device.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
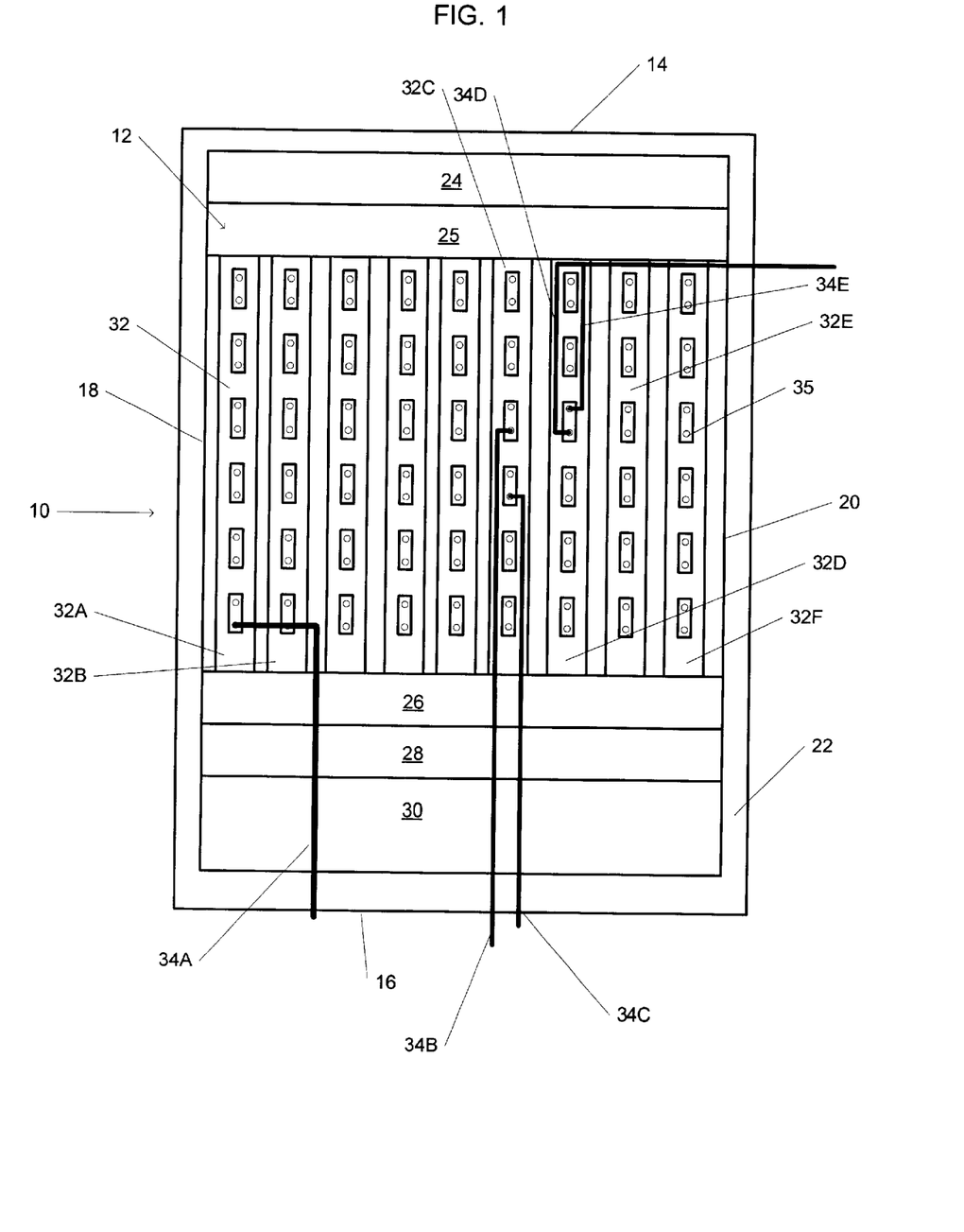
FIG. 1 is a front elevational view illustrating a front panel of a router and the interconnection of various cables.

FIG. 1 is a front elevational view of an example router 10. In one embodiment, router 10 has a chassis that includes a front panel 12, a top panel 14, a bottom panel 16, a left side panel 18 and a right side panel 20. Router 10 is generally representative of any electronic or other type of device that requires the attachment of one or more cables 34A–34E, collectively referred to as cables 34. Cables 34 represent any type of flexible, elongated member that is attached to another device. In the present embodiment, router 10 houses various electronic components that require the attachment of various data and peripheral cables 34.

Router 10 may be placed into a rack with other routers and/or other pieces of equipment. To facilitate placement within a rack or a similar structure, top panel 14, bottom panel 16, left side panel 18 and right side panel 20 are usually devoid of connectors, controls or other types of devices that may need to be routinely accessed. A back panel, not illustrated, may be accessible and may include various components.

Front panel 12 provides the primary surface to which the various cables 34 are attached and includes various other components of router 10 as well. These components may include a control panel 24, an upper fan tray 25, a plurality of interface cards 32, a filter tray 26, a lower fan tray 28, and an air intake 30. Control panel 24 provides controls for utilizing router 10. Fan trays 25, 28 provide air circulation within router 10. Filter tray 26 provides an air filter to filter the air brought in through air intake 30. Each of these components is removable to allow for servicing and repair.

Coupled with each of the interface cards 32 are one or more cable connectors 35. For ease of illustration, only cables 34 are show in FIG. 1, however each cable connector 35 may have one or more cables connected thereto during normal operation. Cables 34 illustrate some of the problems that can be associated with the cable management of router 10. For example, although cable 34A is connected to interface card 32A, it crosses over interface card 32B. Thus, access to interface card 32B is obstructed and, if interface card 32B is to be removed, cable 34A must first be moved.

Cables 34B, 34C avoid this problem by following (running parallel to) interface card 32C. Thus, cables 34B, 34C do not obstruct adjacent interface cards. However, cables 34A, 34B, and 34C cross over and obstruct filter tray 26, fan tray 28 and air intake 30. To service or remove any of these components, a service technician must first move cables 34A, 34B and 34C. When large numbers of cables obstruct a component that needs to be accessed, moving those cables is troublesome, time consuming and problematic. Many of the cables could become disconnected, for example, further increasing the time and complexity of the servicing task. Cables 34D and 34E, which are attached to interface card 32D, illustrate a better cable arrangement, but still obstruct interface cards 32E and 32F.

FIG. 1 illustrates certain cable management issues involving router 10. These and other problems are addressed on router 10 in FIG. 2, which is a front elevational view illustrating a cable manager 50 coupled to router 10 to direct cables 34A, 34B along a desired path. In the illustrated embodiment, cable manager 50 includes a plurality of bobbins 52 attached to a trough 54. Each bobbin 52 provides a surface for guiding one or more cables through trough 54, which provides an unobstructed passageway for routing the cables.

Figure 2:
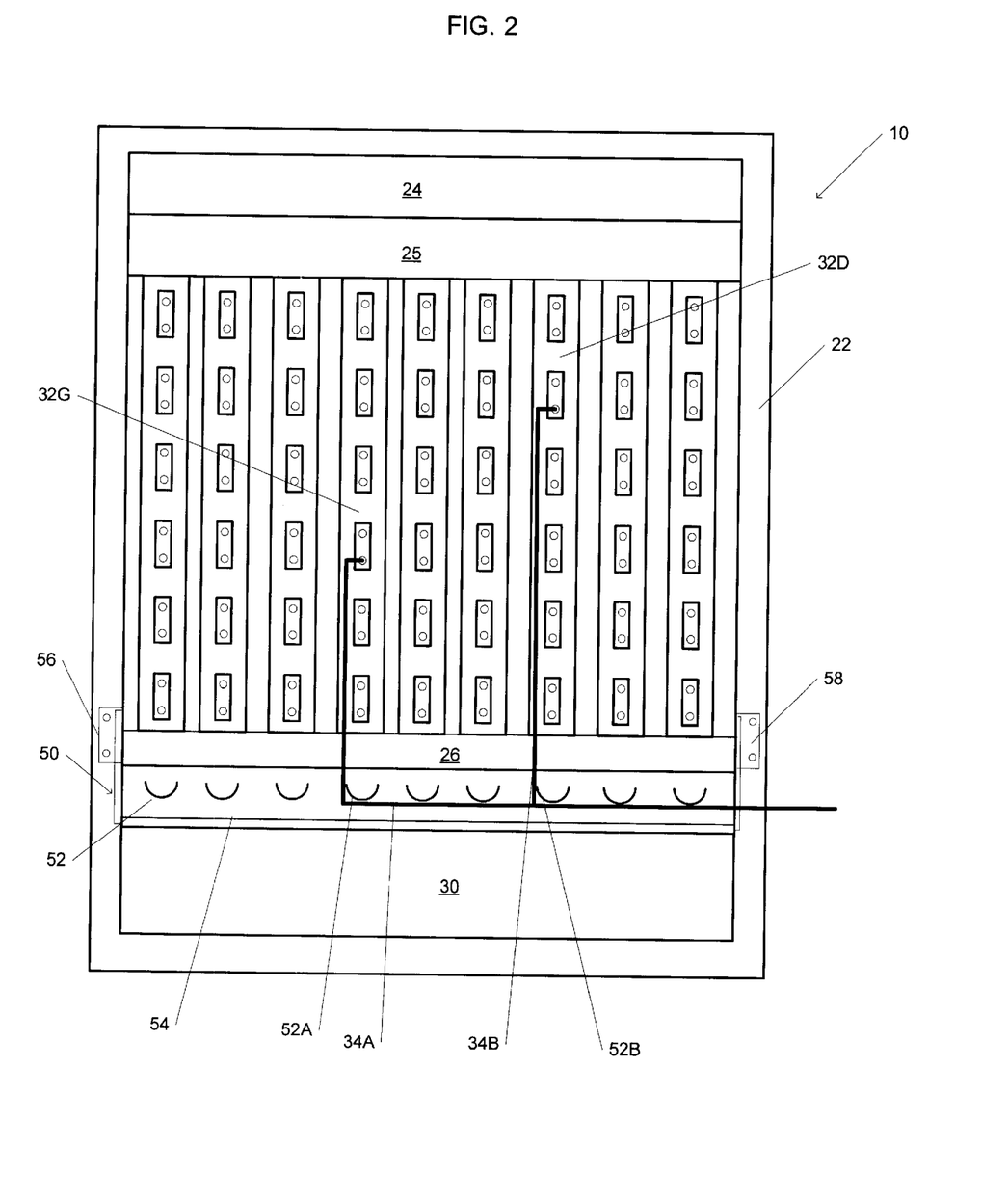
FIG. 2 is a front elevational view illustrating a cable manager consistent with the principles of the invention.

Cable manager 50 is secured to attachment lip 22 of router 10 via upper left bracket 56 and upper right bracket 58. Certain terms such as right, left, upper and lower are used herein only to describe the illustrated embodiments. These terms, which are used in reference the Figures, are for explanatory purposes only and do not limit the invention. Cable manager 50 allows the various cables attached to router 10, such as cable 34A and cable 34B to run along (generally parallel with) their respective interface cards 32G, 32D without interfering with any of the other interface cards 32. When cables 34A, 34B, reach cable manager 50 they are wrapped about bobbins 52A and 52B, directed along (generally parallel with) the width of cable manger 50 through trough 54, and run past the side panel 22 of router 10. The surface provided by each bobbin 52 in one embodiment is generally symmetric in nature. Consequently, once reaching a given bobbin 52, a cable can easily be directed either to the right or the left.

Cable manager 50 is movable between a raised position and a lowered position. FIG. 2 illustrates cable manager 50, consistent with the principles of the invention, in a lowered position, which would typically be used during normal operation of router 10. In this position, cable manager 50 does not obstruct air intake 30 and interface cards 32, allowing the service technician or system administrator to easily access the various interface cards 32. Cable manager 50, however, blocks filter tray 26 and fan tray 28 when it is in the lowered position. However, these components generally do not need to be accessed during normal operation of router 10. Cable manager 50 can be raised, along with all cables 34, 36 coupled thereto, so that filter tray 26 and fan tray 28 are exposed for servicing or other purposes.

In order to accommodate the movement of cable manager 50, a service technician provides a sufficient amount of slack in cables 34 when connecting cables 34 to cable manager 50. Cables 34 connect router 10 to some external point and if there were no slack in cables 34 between cable manager 50 and that external point, it would not be possible to move cable manager 50 from lowered position to the upper position. In one embodiment, cable manager 50 may include a gauge (not shown) to help the service technician determine the proper amount of slack to leave in cables 34.

Figure 3:
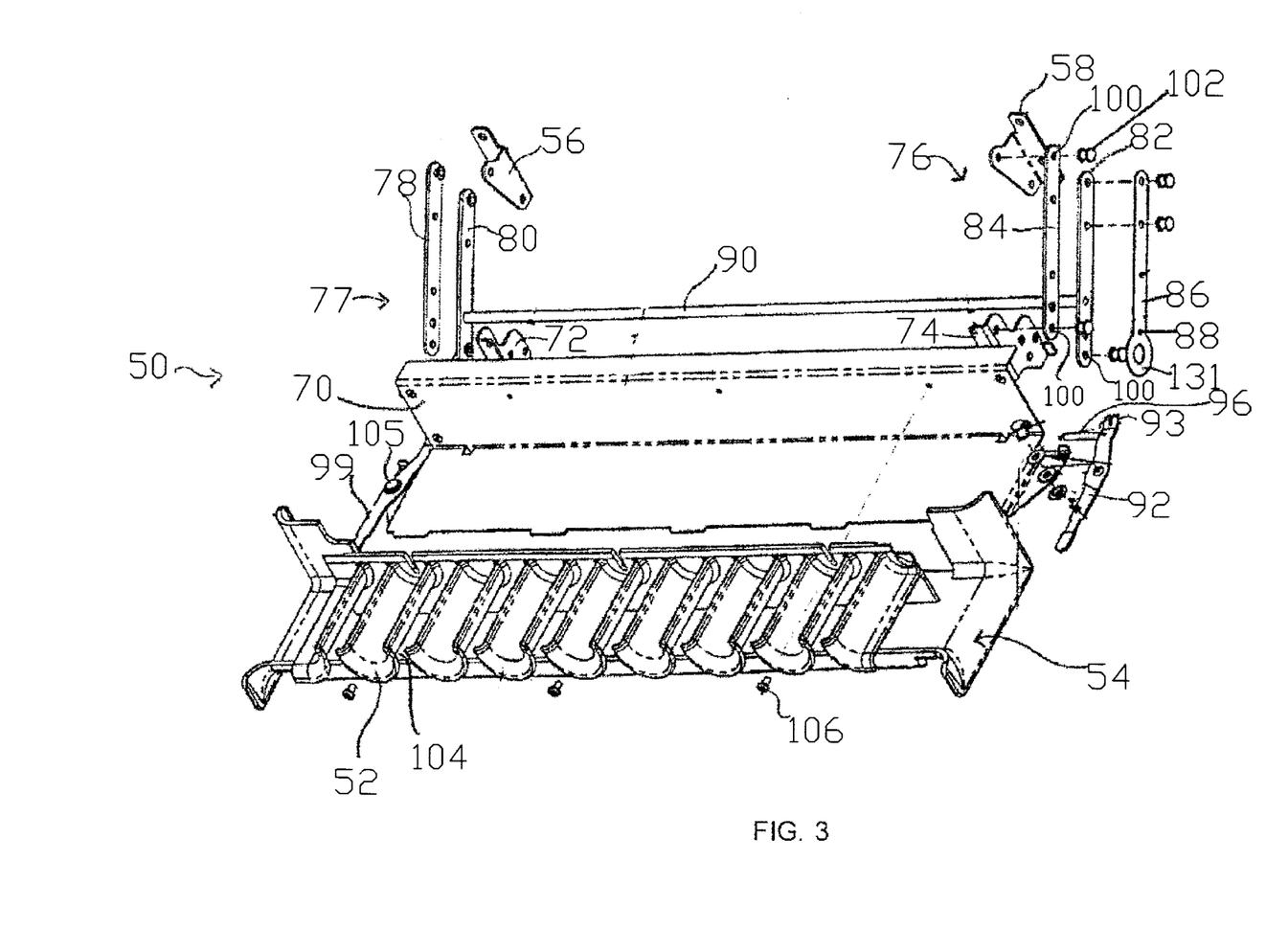
FIG. 3 is an exploded assembly view of the components of one embodiment of the cable manager.

FIG. 3 is an exploded assembly view illustrating an example embodiment of cable manager 50. Cable manager 50 includes a plurality of cable guides such as bobbins 52. Bobbins 52 may be semi-cylindrical elements separated by slots 104. One or more cables pass through a given slot 104 and then partially wrap about the cylindrical portion of a given bobbin 52. Bobbins 52 are coupled with trough 54. Thus, as cables wrap around an individual bobbin 52, trough 54 guides and supports the cables so as to direct them along trough 54. Bobbins 52 and trough 54 may be integrally formed and may be made of plastic, metal or any other material. Trough 54 and bobbins 52 generally form a tray structure for receiving and guiding cables. Various other configurations of such a tray can be utilized to receive and guide cables. For example, clips or locks (not shown) located between bobbins 52 could further secure cables 34 in place.

Trough 54 may be coupled to a support tray 70 formed of metal, plastic or another material. Attachment of trough 54 to support tray 70 may be accomplished with screws 106 or other attachment mechanisms. Support tray 70 provides a base to which various other components, including trough 54, may be attached. In another embodiment, support tray 70 may be eliminated. Instead the various components are attached directly to trough 54.

Cable manager 50 can be securely affixed to router 10 (or other device) via a connection mechanism, such as left and right four-bar linkages 77, 76, respectively. Right four-bar linkage 76 includes a right upper bracket 58 that is fixedly attached to router 10 via screws, rivets, bolts, welding, latches or any other permanent or temporary connection medium. An upper link arm 84 and a lower link arm 82 are respectively pivotally connected to right upper bracket 58. For example, rivet 102 couples upper link arm 84 to right upper bracket 58. This allows lower link arm 82 to pivot freely with respect to right upper bracket 58. A right lower bracket 74 is fixedly attached to support tray 70. Lower and upper link arms 82, 84 are respectively pivotally coupled with right lower bracket 74. Thus, upper bracket 58, lower bracket 74, upper link arm 84 and lower link arm 82 form four bar linkage 76. This arrangement allows for relative motion between right upper bracket 58 and right lower bracket 74 via the motion of pivoting support arms 82, 84. As illustrated, the opposing sides of four bar linkage 76 will remain generally parallel to one another despite their movement. That is, lower link arm 82 will remain generally parallel with upper link arm 84 and right upper bracket 58 will remain generally parallel with right lower bracket 74.

Other four bar linkage configurations would provide for different paths of travel that maybe desirable in certain circumstances. For example, if the opposing sides were made non-parallel, trough 54 would tilt as it travels along its path of movement. Making the opposing sides different lengths would produce the non-parallel configuration. Whether parallel or not, the four bar linkage serves to constrain the position of cable manager 50 relative to the chassis.

Left four bar linkage 77 is similar to right four bar linkage 76 and includes a left upper bracket 56, a left lower bracket 72, a lower left link arm 80 and an upper right link arm 78. The components of right and left four bar linkages 76, 77 can be formed from metal, plastic, or any other suitable material. As explained above, motion of either right or left four bar linkages 76, 77 will cause the various opposing components within the four bar linkage to remain generally parallel to one another. Torsion bar 90 is provided to mechanically link right four bar linkage 76 to left four bar linkage 77 so that they also remain aligned with one another.

Right and left four bar linkages 76, 77 allow support tray 70 (and the components attached thereto) to be moved with respect to upper left and right brackets 56, 58. This motion will be described in greater detail below. In this embodiment, support tray 70 is moved from a lower position to an upper position. It is desirable to lock or secure support tray 70 in the position selected. To facilitate locking latch bar 86 is provided. Latch bar 86 is a flexible, resilient member that is substantially similar to lower link arm 82. Latch bar 86 includes an oversized head portion 131 that has a diameter greater than that of the width of lower link arm 82. A locking pin 88 extends from latch spring 86 towards lower link arm 82. Pivotally coupled with support tray 70 is a right latch lever 92. Right latch lever 92 pivots generally from right to left and vice versa, as illustrated.

Right latch lever 92 includes a bifurcated tip 93 that engages head portion 131. An extension spring 96 biases bifurcated tip 93 towards support tray 70. Thus, as latch lever 92 is engaged and caused to pivot, bifurcated tip 93 causes head portion 131 to move away from lower link arm 82, which in turn causes locking pin 88 to release. When latch lever 92 is not engaged, right latch lever 92 is generally coplanar with link arm 82 and locking pin 88 is engaged if aligned with link arm 82. Though not illustrated in FIG. 3, a second latch bar can be provided adjacent left lower link arm 80 that interacts with left latch lever 94. Alternative locking mechanisms could be utilized in lieu of those illustrated. Such a locking mechanism should latch both four bar mechanisms and should allow an operator to select from multiple positions. Preferably, a selected alternative locking mechanism would operate easily while manipulating cable manager 50 and would latch both four bar mechanisms simultaneously.

FIGS. 4–13 illustrate the operation of the elements located on the left end of cable manager 50. The corresponding elements on the right end of cable manager 50 operate in a substantially similar fashion.

Figure 4:
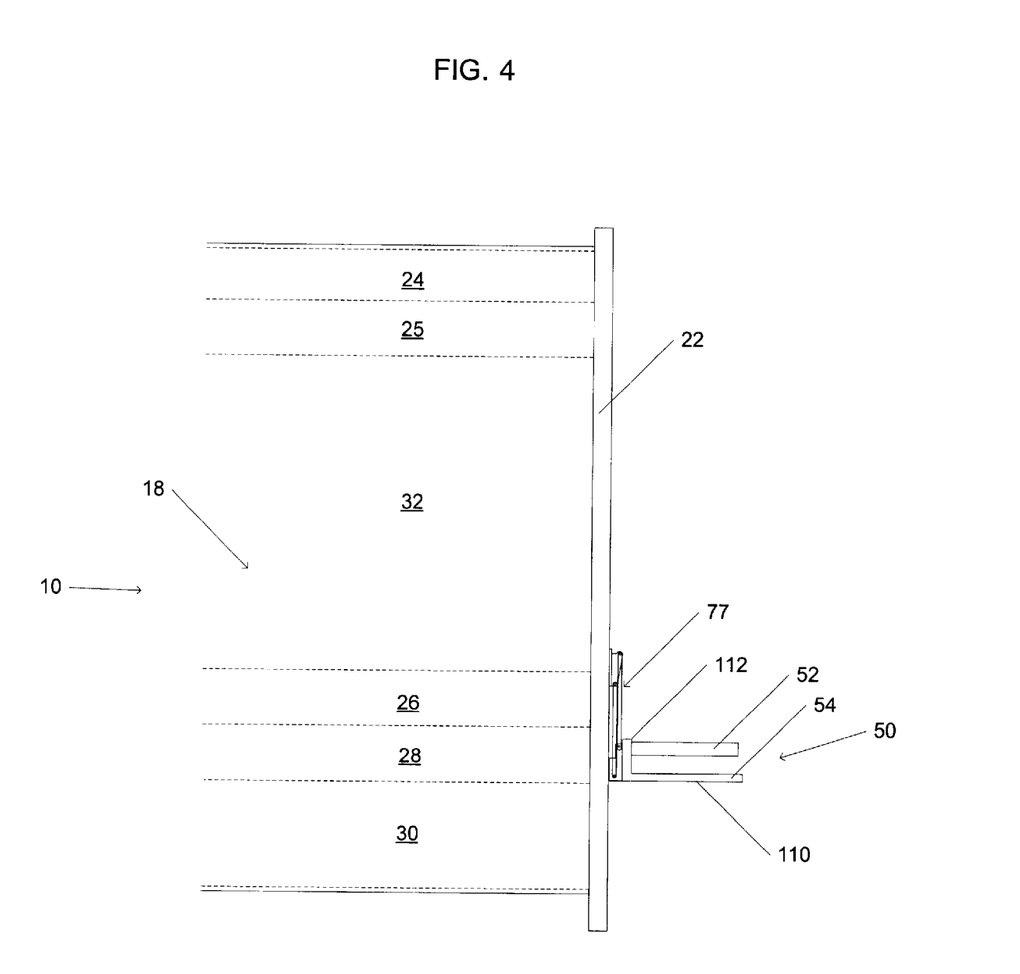
FIG. 4 is a side, partially sectional view of a router with a cable manager attached and in a lowered position.

FIG. 4 is a side, partially, sectional view of router 10 with cable manager 50 attached and in a lowered position. As illustrated, a bottom edge 10 of cable manager 110 is above air intake 30, which should not be obstructed. Interface cards 32 are also completely unobstructed. That is, an upper edge 112 is positioned below the lowermost portion of interface cards 32. Left four bar linkage 77 at least partially extends beyond a plane defined by the lowermost portion of interface cards 32; however, left four bar linkage is coupled to attachment lip 22 which surrounds the perimeter of router 10, thus preventing obstruction of the components.

Figure 5:
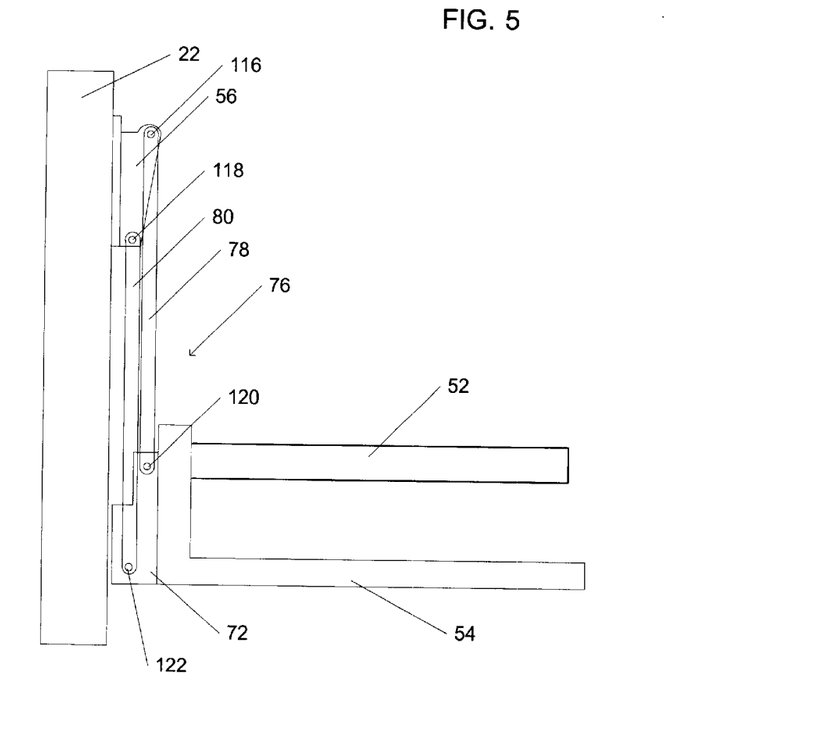
FIG. 5 is side elevational view of a cable manager in a lowered position.
Figure 6:
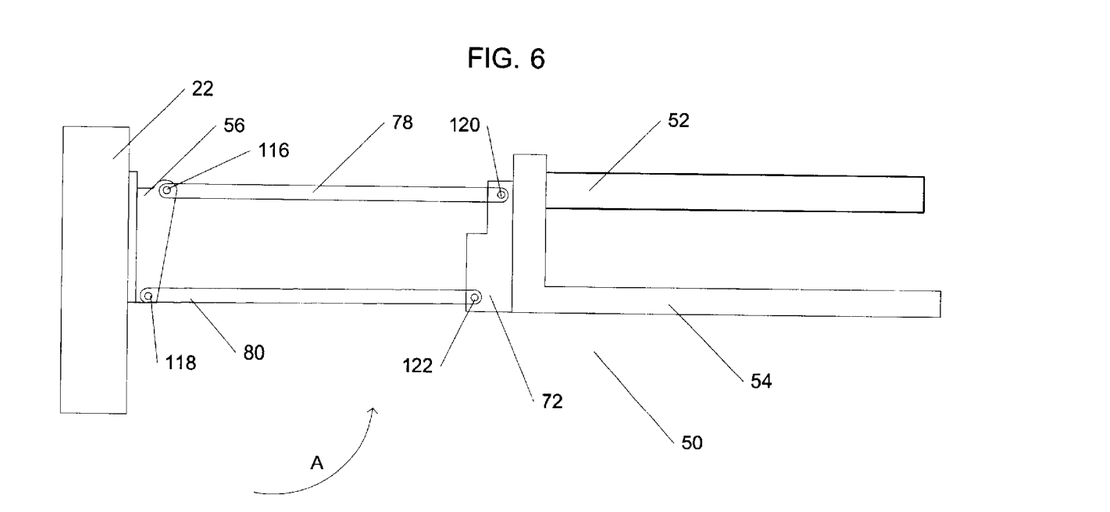
FIG. 6 is a side elevational view of a cable manager in a raised position.

FIGS. 5 and 6 are side views illustrating two of the positions that cable manager 50 can be positioned in. FIG. 5 represents the same position illustrated in FIG. 4. As trough 54 is roved from the position illustrated in FIG. 5 to that of FIG. 6 as indicated by arrow A, left upper bracket 56 and left lower bracket 72 remain generally parallel with one another. Upper link arm 78 pivots about pivot points 116, 120 and lower link arm 80 pivots about pivot points 118, 122. Upper link arm 78 and lower link arm 80 also remain generally parallel with one another. As trough 54 is moved, any cables wrapped about bobbins 52 will also move. Thus, simple cable management and movement are achieved.

Figure 7:
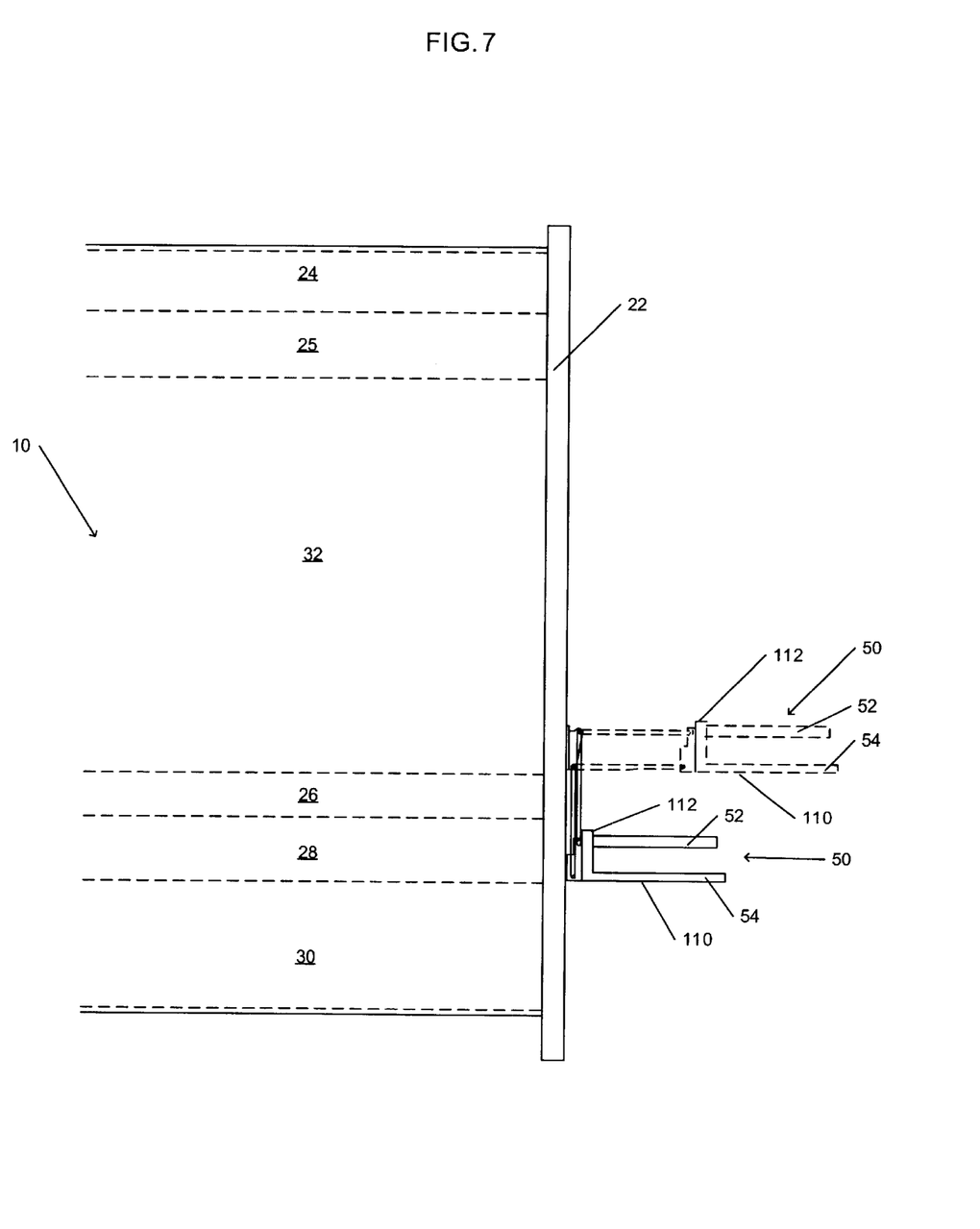
FIG. 7 is a side, partially sectional view illustrating a cable manager in a lowered position and illustrating (in phantom) a cable manager in a raised position.

FIG. 7 illustrates cable manager 50 in a lowered position with respect to router 10 and illustrates in phantom, cable manager 50 in a raised position with respect to router 10. As previously described, cable manager 50 is sized so that when in the lowered position the bottom edge 110 does not occlude air intake 30 and the upper edge 112 does not occlude interface cards 32. In the raised position, bottom edge 110 is above the uppermost portion of filter tray 26, thus allowing full access to filter tray 26 and fan tray 28. That is, cable tray 50 is moved out of the way, along with any cables attached thereto. Of course, when cable manager 50 is used with other devices, its size and positioning will be chosen to correspond with the components of that device.

Figure 8:
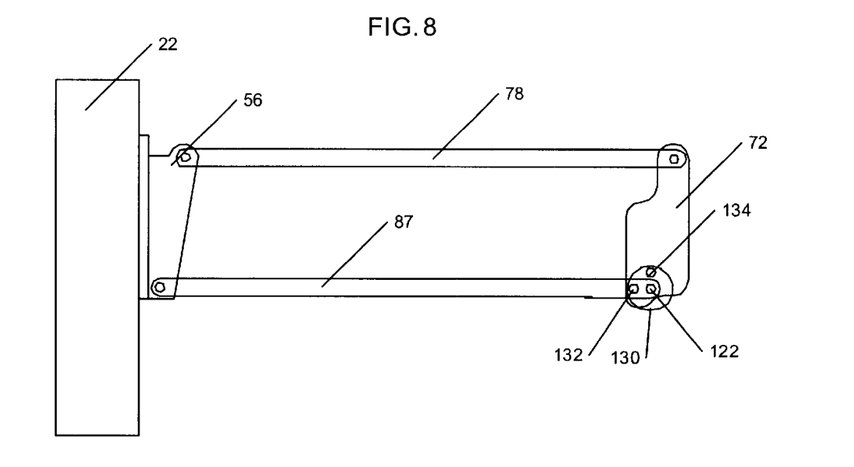
FIG. 8 is side elevational view of a four bar linkage assembly.

FIG. 8 illustrates in greater detail the latching mechanism of cable manager 50. Left lower bracket 72 is shown in a raised position with respect to left upper bracket 56. In this view, left lower link arm 80 is obscured by left latch bar 87, which terminates in a generally circular latch spring head 130. As link arm 80 and latch spring 87 rotate about pivot point 122, locking pin 136 (not shown in FIG. 8), can either engage upper locking hole 132 or lower locking hole 134. When engaged with upper locking hole 132, link arm 80 is locked into the raised position. When engaged with lower locking hole 134, link arm 80 is locked into the lowered position. While two locking holes 132, 134 have been shown, more could be provided so as to allow cable manager 50 to be locked into any number of positions.

Figure 9:
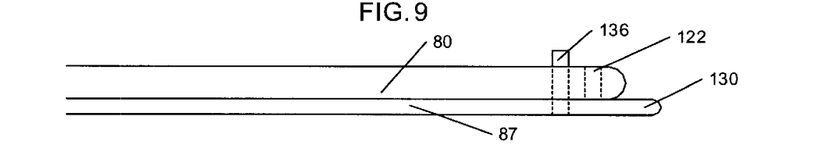
FIG. 9 is a top, planar and partially sectional view of a portion of a link arm with an attached leaf spring.
Figure 10:
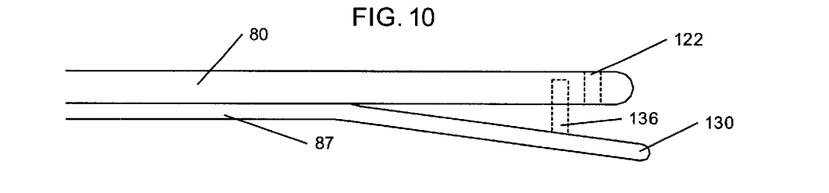
FIG. 10 is a top, planar and partially sectional view of a portion of a link arm with an attached leaf spring shown in an extended position.

FIGS. 9 and 10 illustrate the cooperation of locking pin 136 with link arm 80 and latch spring 87. Locking pin 136, which is coupled with latch spring 87, extends through a hole in link arm 80. When properly aligned, locking pin 136 will extend through link arm 80 and enter either upper or lower locking holes 132, 134 and thus prevent the further rotational movement of link arm 80 about pivot point 122. Because of the design of left four bar linkage 77, this prevents any of the elements of that linkage from further movement. To release locking pin 136, latch spring head 130 is engaged by left latch lever 94 (FIG. 3) and is caused to flex away from link arm 80. This causes locking pin 136 to retract at least partially through the hole in link arm 80, causing locking pin 136 to disengage from either upper or lower locking hole 132, 134. As link arm 80 is pivoted, lower bracket 72 will continue to cause locking pin 136 to remain partially retracted, and also cause latch spring 87 to be partially flexed away from link arm 80. This continues until link arm 80 is pivoted to a point where locking pin 136 is aligned with either upper or lower locking holes 132, 134. When so aligned, the resiliency of latch spring 87 and the force exerted by left extension spring 96 cause locking pin 136 to engage the aligned locking holes 132, 134.

Figures 11, 12:
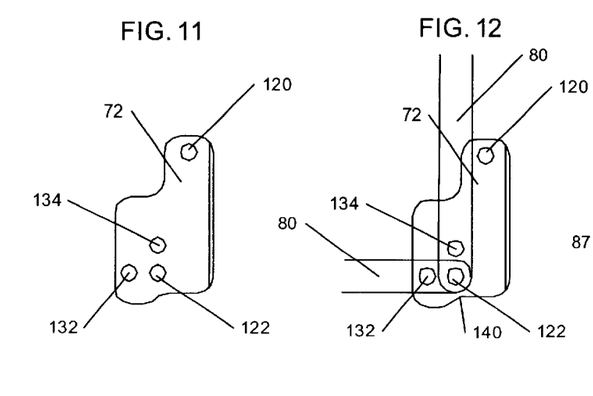
FIG. 11 is a side elevational view of a lower bracket.
FIG. 12 is a side elevational view of a lower bracket with an attached lower link arm, shown in both a raised and lowered position.
Figure 13:
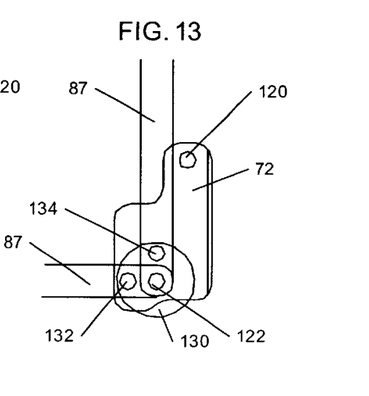
FIG. 13 is a side elevational view of a lower bracket with an attached lowerlink arm and leaf spring, shown in both a raised and lowered position.

FIGS. 11–13 illustrate the cooperation of lower link arm 80 with lower left bracket 72. Lower left bracket 72 is illustrated by itself in FIG. 11. Here, the relationship between pivot point 122 and upper and lower locking holes 132, 134 is shown in greater detail. Once again, more locking holes 132, 134 could be added to allow cable manager 50 to be locked into alternative positions. FIG. 12 illustrates the two extreme positions taken by left lower link arm 80 in this embodiment. FIG. 13 also illustrates the same two extreme positions and illustrates the position of latch spring 87 relative thereto. As shown, regardless of the position chosen, latch spring head 130 extends at least partially beyond bracket 72. This is due to the circular configuration of latch spring head 130 and the way it cooperates with bracket indent 140. Thus, whatever position latch spring 87 may be in, latch lever 94 (FIG. 3) will always be able to engage it. Of course, various other latching and locking mechanisms could be employed to secure cable manager 50 into one or more positions.

A number of embodiments of the present invention have been described. Nevertheless, it will be understood that various modifications may be made without departing from the spirit and scope of the invention. Accordingly, other embodiments are within the scope of the following claims. For example, the size and configuration of the cable management tray and the components that interconnect with the cable can be varied. Furthermore, the present invention is not limited to use with routers. The cable manager can be used with any device having connections for one or more cables.

Assemblies consistent with the principles of the invention may be used to hold other elements instead of or in addition to cables. For example, such assemblies may hold elements that supplement the operation of the chassis in some way or elements that assist in servicing or operating the chassis or its components. Such assemblies may even hold elements that are used with other elements adjacent to the chassis.

For example, such an assembly may hold test equipment used to test components in the chassis. Or the assembly may hold functional elements that in some way enhance the operation of the elements in the chassis, or functional elements that operate in conjunction with components in the chassis and components outside the chassis. For example, the assembly could hold a unit that interfaces between the chassis or elements in the chassis, and another chassis or other device. In this way, elements used in conjunction with the chassis or apparatus adjacent to the chassis can be conveniently positioned on the assembly and can be conveniently moved as described herein.

Multiple assemblies may be attached to a chassis on the same side of the chassis or on different sides. Assemblies may also be attached adjacent to one another.

What is claimed is:

1. An apparatus comprising:
   a chassis coupleable to a plurality of cables;
   a cable guide; and
   a bracket assembly pivotally coupled between the cable guide and the chassis, the cable guide having connections configured to receive and guide the cables, wherein the bracket assembly allows the cable guide to pivot between a first position disposed adjacent the chassis and a second position disposed remotely from the chassis.

2. The apparatus of claim 1, wherein the cable guide comprises:
   a trough; and
   a plurality of bobbins coupled with the trough so that cables may be passed between adjacent bobbins and supported and guided by the trough.

3. The apparatus of claim 2, wherein the cable guide further comprises a support tray disposed between the trough and the bracket assembly.

4. The apparatus of claim 1 further comprising:
   a locking assembly coupled to the cable guide and the bracket assembly so that the cable guide can be selectively locked into one of the first and second positions.

5. The apparatus of claim 4, wherein the locking assembly comprises:
   a latch element coupleable with the bracket assembly;
   an locking pin attached to: the latch element, positioned to engage at least one locking hole in the bracket assembly; and
   a latch lever coupleable with the cable guide so that it can selectively engage the latch element and cause the locking pin to selectively engage and disengage the locking hole.

6. The apparatus of claim 1, wherein the bracket assembly includes a four bar linkage.

7. The apparatus of claim 6, wherein the four bar linkage comprises:
   a first bracket coupleable to the device;
   a second bracket coupleable to the cable guide;
   a first link arm pivotally connected to the first bracket and pivotally connected to the second bracket; and
   a second link arm pivotally connected to the first bracket and pivotally connected to the second bracket.

8. The apparatus of claim 1, wherein the chassis includes a first component, the cable guide being sized so that when in the first position the cable guide does not obscure the first component.

9. The apparatus of claim 8 wherein the first component is an air intake.

10. The apparatus of claim 8 wherein the cable guide at least partially obstructs a second component of the chassis when the cable guide is in the first position.

11. The apparatus of claim 10, wherein the cable guide does not obscure the second component when in the second position.

12. The apparatus of claim 11, wherein the second component includes a fan tray.

13. The apparatus of claim 11, wherein the second component includes a filter tray.

14. The apparatus of claim 11, wherein the second component includes a filter tray and a fan tray.

15. An apparatus comprising:
a chassis coupleable to a plurality of cables;
receiving means for receiving and guiding a plurality of cables coupled to the chassis; and
moving means for pivoting the receiving means between a first position disposed adjacent the chassis and a second position disposed remotely from the chassis.

16. The apparatus of claim 15, further comprising:
means for locking the receiving means in a first position and a second position relative to the chassis.

17. An apparatus comprising:
a chassis coupleable to a plurality of cables;
a first linking mechanism including a first upper bracket coupleable to the chassis and connected to a first lower bracket;
a second linking mechanism including a second upper bracket coupleable to the chassis and connected to a second lower bracket; and
a tray coupled with the first lower bracket and the second lower bracket, wherein the tray is moveable relative to the chassis and the tray. is configured to receive and guide cables.

18. The apparatus of claim 17, further comprising:
a first locking mechanism coupled with the first linking mechanism whereby the tray may be selectively locked into a given position relative to the chassis.

19. The apparatus of claim 17, wherein the tray includes a trough and a plurality of bobbins.

20. The apparatus of claim 17 wherein the size of the tray is selected so that when the tray is in a first position relative to the chassis, the tray is situated between a first component of the chassis and a second component of the chassis.

21. An apparatus comprising:
a cable guide; and
a bracket assembly to couple the cable guide to a device having connections for one or more cables, wherein the bracket assembly allows the cable guide to be moved between at least two positions relative to the device.

22. The apparatus of claim 21, wherein the cable guide further comprises:
a trough; and
a plurality of bobbins coupled with the trough so that cables may be passed between adjacent bobbins and supported and guided by the trough.

23. The apparatus of claim 22, wherein the cable guide further comprises a support tray disposed between the trough and the bracket assembly.

24. The apparatus of claim 21 further comprising:
a locking assembly coupled to the cable guide and the bracket assembly so that the cable guide can be selectively locked into one of the at least two positions.

25. The apparatus of claim 24, wherein the locking assembly comprises:
a latch element coupleable with the bracket assembly;
a locking pin attached to the latch element, positioned to engage at least one locking hole in the bracket assembly; and
a latch lever coupleable with the cable guide so that it can selectively engage the latch element and cause the locking pin to selectively engage and disengage the locking hole.

26. The apparatus of claim 21, wherein the bracket assembly includes at least one four bar linkage.

27. The apparatus of claim 26, wherein the four bar linkage comprises:
a first bracket coupleable to the device;
a second bracket coupleable to the cable guide;
a first link arm pivotally connected to the first bracket and pivotally connected to the second bracket; and
a second link arm pivotally connected to the first bracket and pivotally connected to the second bracket.

28. A cable manager comprising:
a first four bar assembly, the first four bar assembly including a first upper bracket coupleable to an outer perimeter of a chassis, a first lower bracket, a first upper link arm pivotally connected between the first upper bracket and the first lower bracket and a first lower link arm pivotally connected between the first upper bracket and the first lower bracket;
a second four bar assembly, the second four bar assembly including a second upper bracket coupleable to an outer perimeter of the chassis, a second lower bracket, a second upper link arm pivotally connected between the second upper bracket and the second lower bracket and a second lower link arm pivotally connected between the second upper bracket and the second lower bracket;
a torsion bar connected between the first four bar assembly and the second four bar assembly;
a support tray coupled with the first lower bracket and the second lower bracket, wherein the support tray is moveable relative to the chassis between a raised position and lowered position; and
a trough coupled with the support tray and including a plurality of bobbins, the trough further including an uppermost edge and a lowermost edge.

29. The cable manager of claim 28, further comprising:
a first latch element, the first latch element is coupled with the first lower link arm so as to pivot with the first lower link arm;
a first locking pin coupled with the first latch element and extending through a hole in the first lower link arm; and
a first locking hole through the first lower bracket positioned so that the first locking pin may be selectively engaged with the first locking hole, thereby locking the first four bar assembly.

30. The cable manager of claim 29, further comprising:
a first latch lever pivotally coupled with the support tray and positioned to selectively engage the first latch element, wherein engaging the first latch element causes the first latch element to flex.

31. The cable manager of claim 30, further comprising a first extension spring coupled between the support tray and the first latch lever to bias a portion of the first latch lever engaging the first latch element.

32. The cable manager of claim 31, further comprising:
a second latch element that is coupled with the second lower link arm so as to pivot with the second lower link arm;
a second locking pin coupled with the second latch spring and extending through a hole in the second lower link arm; and a second locking hole through the second lower bracket positioned so that the second locking pin may be selectively engaged with the second locking hole, thereby locking the second four bar assembly.

33. The cable manager of claim 32, further comprising:
a second latch lever pivotally coupled with the support tray and positioned to selectively engage the second latch element, wherein engaging the second latch element causes the second latch element to flex.

34. The cable manager of claim 33, further comprising a second extension spring coupled between the support tray and the second latch lever to bias a portion of the second latch lever engaging the second latch element.

35. The cable manager of claim 29, wherein when the trough is positioned in the lowered position the trough does not obstruct a first component of the router.

36. The cable manager of claim 35, wherein the first component is an air intake.

37. The cable manager of claim 35, wherein when the trough is positioned in the lowered position the trough does not obstruct a second component of the chassis.

38. The cable manager of claim 37 wherein the second component includes cable connectors to which the cables are connected.

39. The cable manager of claim 37 wherein the trough obstructs a third component when in the lowered position.

40. The cable manager of claim 39 wherein when the trough is positioned in the raised position, the third component is not obstructed by the trough.

41. A cable manager comprising:
tray configured to receive and guide cables;
a first four bar linkage coupleable between the tray and a device having one or more cables, wherein the tray is positionable in at least two positions with respect to the device; and
a locking mechanism coupled between the tray and the four bar linkage, configured to selectively secure the tray relative to the device.

42. The cable manager of claim 41, wherein the tray includes a plurality of bobbins.

43. The cable manager of claim 41 further comprising a second four bar linkage coupleable between the tray and the device.

44. The cable manager of claim 43, wherein the first four bar linkage is connected to the second four bar linkage.

45. The cable manager of claim 43, wherein the first four bar linkage is connected to the second four bar linkage with a torsion bar.

46. A cable manager comprising:
a first four bar assembly, the first four bar assembly including a first upper bracket coupleable to an object, a first lower bracket, a first upper link arm pivotally connected between the first upper bracket and the first lower bracket and a first lower link arm pivotally connected between the first upper bracket and the first lower bracket;
a second four bar assembly, the second four bar assembly including a second upper bracket coupleable to the object, a second lower bracket, a second upper link arm pivotally connected between the second upper bracket and the second lower bracket and a second lower link arm pivotally connected between the second upper bracket and the second lower bracket;
a torsion bar connected between the first four bar assembly and the second four bar assembly; and
a tray coupled with the first lower bracket and the second lower bracket, wherein the support tray is moveable relative to the object and the tray is configured to receive and guide cables.

47. The cable manager of claim 46, further comprising:
a first latch element that is coupled with the first lower link arm so as to pivot with the first lower link arm;
a first locking pin coupled with the first latch spring and extending through a hole in the first lower link arm; and
a first locking hole through the first lower bracket positioned so that the first locking pin may be selectively engaged with the first locking hole, thereby locking the first four bar assembly.

48. The cable manager of claim 47, further comprising:
a first latch lever pivotally coupled with the support tray and positioned to selectively engage the first latch element, wherein engaging the first latch element causes the first latch spring to flex.

49. The cable manager of claim 48, further comprising a first extension spring coupled between the tray and the first latch lever to bias a portion of the first latch lever engaging the first latch element.

50. The cable manager of claim 46, wherein the tray includes a trough and a plurality of bobbins.

51. A method of managing cables coupled to a chassis, the method comprising:
coupling a moveable cable tray to the chassis;
placing the cables in the cable tray;
placing the cable tray in an operating position that does not interfere with first elements of the chassis; and
moving the cable tray to a service position to expose a component of the chassis obstructed by the cable tray when in the operating position.

52. A method of operating a chassis, the method comprising:
positioning a moveable cable tray that is connected to the chassis into an operating position;
placing cables coupled with the chassis in the cable tray to guide the cables; and
moving the cable tray relative to the chassis and into a service position in order to service a component of the chassis covered by the cable tray when the cable tray is in the operating position.

53. The method of claim 52, further comprising locking the cable tray relative to the chassis when in the service position.

54. The method of claim 52, further comprising locking the cable tray relative to the chassis when in the operating position.

55. A method of managing cables coupled with a chassis comprising:
placing the cables in a cable tray coupled with the chassis; and
raising the cable tray and the cables to a position remote from the chassis so that a component of the chassis may be accessed, while the cable tray continues to be coupled to the chassis by a bracket assembly.

56. An apparatus comprising:
a chassis useable with a supplemental element;
a tray; and
a bracket assembly coupled between the cable guide and the chassis, wherein the tray is configured to receive the supplemental element and the bracket assembly allows the tray to pivot between a first position and a second position relative to the chassis, wherein the tray occupies substantially horizontal orientations in both the first and the second positions.

57. The apparatus of claim 56 wherein the supplemental element is a plurality of cables and the tray is a cable guide.

58. The apparatus of claim 57, wherein the cable guide comprises:

a trough; and a plurality of bobbins coupled with the trough so that cables may be passed between adjacent bobbins and supported and guided by the trough.

59. The apparatus of claim 56 further comprising:

a locking assembly coupled to the tray and the bracket assembly so that the tray can be selectively locked into one of the at least two positions.

60. The apparatus of claim 59, wherein the locking assembly comprises:

a latch element coupleable with the bracket assembly;

an locking pin attached to the latch element, positioned to engage at least one locking hole in the bracket assembly; and a latch lever coupleable with the tray so that it can selectively engage the latch element and cause the locking pin to selectively engage and disengage the locking hole.

61. The apparatus of claim 56, wherein the bracket assembly includes a four bar linkage.

62. The apparatus of claim 56, wherein the tray includes a first component, the cable guide being sized so that when in the first position the cable guide does not obscure the first component.

63. An apparatus comprising:

a chassis useable with an associated element;

a tray configured to receive the associated element;

a first four bar linkage coupleable between the tray and the chassis, wherein the tray is positionable in at least two positions with respect to the chassis; and a locking mechanism coupled between the tray and the four bar linkage, configured to selectively secure the tray relative to the chassis.

64. The apparatus of claim 63, wherein the associated element is a plurality of cables.

65. An apparatus comprising:

a chassis useable with an associated element;

a first four bar assembly, the first four bar assembly including a first upper bracket coupleable to the chassis, a first lower bracket, a first upper link arm pivotally connected between the first upper bracket and the first lower bracket and a first lower link arm pivotally connected between the first upper bracket and the first lower bracket;

a second four bar assembly, the second four bar assembly including a second upper bracket coupleable to the chassis, a second lower bracket, a second upper link arm pivotally connected between the second upper bracket and the second lower bracket and a second lower link arm pivotally connected between the second upper bracket and the second lower bracket;

a torsion bar connected between the first four bar assembly and the second four bar assembly; and a tray coupled with the first lower bracket and the second lower bracket, wherein the tray is moveable relative to the chassis and the tray is configured to receive the associated element.

66. The apparatus of claim 65, wherein the associated element is a plurality of cables.

67. The apparatus of claim 65, further comprising:

a first latch element, the first latch element is coupled with the first lower link arm so as to pivot with the first lower link arm;

a first locking pin coupled with the first latch element and extending through a hole in the first lower link arm; and a first locking hole through the first lower bracket positioned so that the first locking pin may be selectively engaged with the first locking hole, thereby locking the first four bar assembly.

68. The apparatus of claim 67, further comprising:

a first latch lever pivotally coupled with the support tray and positioned to selectively engage the first latch element, wherein engaging the first latch element causes the first latch element to flex away from the first lower link arm.

69. The apparatus of claim 68, further comprising a first extension spring to bias a portion of the first latch lever engaging the first latch element.

70. An apparatus comprising:

a chassis useable with an associated element;

a first linking mechanism including a first upper bracket coupleable to the chassis and connected to a first lower bracket;

a second linking mechanism including a second upper bracket coupleable to the chassis and connected to a second lower bracket; and a tray coupled with the first lower bracket and the second lower bracket, wherein the tray is moveable relative to the chassis between a first position adjacent the chassis and a second position remote from the chassis, and the tray is configured to receive the associated element.

71. The apparatus of claim 70, wherein the associated element is a plurality of cables.

72. The apparatus of claim 70 wherein the size of the tray is selected so that when the tray is in a first position relative to the chassis, the tray is situated between a first component of the chassis and a second component of the chassis.

73. An apparatus comprising:

a cable guide that guides cables coupled to a chassis;

a bracket assembly that selectively supports the cable guide in a first position adjacent the chassis and a second position remote from the chassis.

74. The apparatus of claim 73 further comprising;

a locking assembly coupled to the cable guide and the bracket assembly to selectively lock the cable guide into one of the first and second positions.

75. The apparatus of claim 74, wherein the locking assembly comprises:

a latch element coupleable with the bracket assembly;

an locking pin attached to the latch element, positioned to engage at least one locking hole in the bracket assembly; and a latch lever coupleable with the cable guide so that it can selectively engage the latch element and cause the locking pin to selectively engage and disengage the locking hole.

76. The apparatus of claim 73, wherein the bracket assembly includes a four bar linkage.

* * * * *

UNITED STATES PATENT AND TRADEMARK OFFICE
CERTIFICATE OF CORRECTION

PATENT NO.    : 6,590,785 B1
DATED         : July 8, 2003
INVENTOR(S)   : David Lima et al.

It is certified that error appears in the above-identified patent and that said Letters Patent is hereby corrected as shown below:

Replace claims 1, 15, 27, 69, 77 and 79 with the following new claims:

1. An apparatus comprising:
    a chassis coupleable to a plurality of cables;
    a cable guide; and
    a bracket assembly pivotally coupled between the cable guide and the chassis, the cable guide having connections configured to receive and guide the cables, wherein the bracket assembly allows the cable guide to pivot --in a substantially horizontal orientation-- between a first position disposed adjacent the chassis and a second position disposed remotely from the chassis.

15. An apparatus comprising:
    a chassis coupleable to a plurality of cables;
    receiving means for receiving and guiding a plurality of cables coupled to the chassis; and
    moving means for pivoting the receiving means --in a substantially horizontal orientation-- between a first position disposed adjacent the chassis and a second position disposed remotely from the chassis.

27. An apparatus comprising:
    a chassis coupleable to a plurality of cables;
    a first linking mechanism including a first upper bracket coupleable to the chassis and connected to a first lower bracket.
    a second linking mechanism including a second upper bracket coupleable to the chassis and connected to a second lower bracket; and
    a tray coupled with the first lower bracket and the second lower bracket, wherein the tray is moveable --in a substantially horizontal orientation-- relative to the chassis and the tray is configured to receive and guide cables.

69. A method of managing cables coupled with a chassis comprising:
    placing the cables in a cable tray coupled with the chassis; and
    raising the cable tray and the cables --in a substantially horizontal orientation-- to a position remote from the chassis so that a component of the chassis may be accessed, while the cable tray continues to be coupled to the chassis by a bracket assembly.

77. An apparatus comprising:
    a chassis useable with an associated element;
    a tray configured to receive the associated element;
    a first four bar linkage coupleable between the tray and the chassis, wherein the tray is positionable in at least two positions --in a substantially horizontal orientation-- with respect to the chassis; and
    a locking mechanism coupled between the tray and the four bar linkage, configured to selectively secure the tray relative to the chassis.

UNITED STATES PATENT AND TRADEMARK OFFICE
CERTIFICATE OF CORRECTION

PATENT NO. : 6,590,785 B1
DATED : July 8, 2003
INVENTOR(S) : David Lima et al.

It is certified that error appears in the above-identified patent and that said Letters Patent is hereby corrected as shown below:

Replace claims 1, 15, 27, 69, 77 and 79 with the following new claims:

79. An apparatus comprising:
a chassis useable with an associate element;
a first four bar assembly, the first four bar assembly including a first upper bracket coupleable to the chassis, a first lower bracket, a first upper link arm pivotally connected between the first upper bracket and the first lower bracket and a first lower link arm pivotally connected between the first upper bracket and the first lower bracket;
a second four bar assembly, the second four bar assembly including a second upper bracket coupleable to the chassis, a second lower bracket, a second upper link arm pivotally connected between the second upper bracket and the second lower bracket and a second lower link arm pivotally connected between the second upper bracket and the second lower bracket;
a torsion bar connected between the first four bar assembly and the second four bar assembly; and
a tray coupled with the first lower bracket and the second lower bracket, wherein the tray is moveable --in a substantially horizontal orientation-- relative to the chassis and the tray is configured to receive the associated element.

84. An apparatus comprising:
a chassis useable with an associated element;
a first linking mechanism including a first upper bracket coupleable to the chassis and connected to a first lower bracket;
a second linking mechanism including a second upper bracket coupleable to the chassis and connected to a second lower bracket; and
a tray coupled with the first lower bracket and the second lower bracket, wherein the tray is moveable --in a substantially horizontal orientation-- relative to the chassis between a first position adjacent the chassis and a second position remote from the chassis, and the tray is configured to receive the associated element.

87. An apparatus comprising:
a cable guide that guides cables coupled to a chassis; --and--
a bracket assembly that selectively "supports" --pivots-- the cable guide in --a substantially horizontal orientation between-- a first position adjacent the chassis and a second position remote from the chassis.

Signed and Sealed this

Ninth Day of November, 2004

JON W. DUDAS
*Director of the United States Patent and Trademark Office*

UNITED STATES PATENT AND TRADEMARK OFFICE
CERTIFICATE OF CORRECTION

PATENT NO.     : 6,590,785 B1
DATED          : July 8, 2003
INVENTOR(S)    : David Lima et al.

It is certified that error appears in the above-identified patent and that said Letters Patent is hereby corrected as shown below:

<u>Title page,</u>
Item [76], Inventor, should read -- Tony Joseph Lillios -- rather than "Tony Joseph Lilios".

Signed and Sealed this

Twentieth Day of September, 2005

JON W. DUDAS
*Director of the United States Patent and Trademark Office*